(12) United States Patent
Buynoski

(10) Patent No.: US 6,660,608 B1
(45) Date of Patent: Dec. 9, 2003

(54) METHOD FOR MANUFACTURING CMOS DEVICE HAVING LOW GATE RESISTIVITY USING ALUMINUM IMPLANT

(75) Inventor: Matthew Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/084,560

(22) Filed: Feb. 25, 2002

(51) Int. Cl.[7] ............................................. H01L 21/331
(52) U.S. Cl. ..................... 438/369; 438/372; 438/373
(58) Field of Search .................. 438/369, 372, 438/373

(56) References Cited

U.S. PATENT DOCUMENTS

| | | | |
|---|---|---|---|
| 4,746,964 A | * | 5/1988 | Aronowitz .................. 357/63 |
| 4,910,160 A | | 3/1990 | Jennings et al. |
| 4,940,671 A | | 7/1990 | Small et al. |
| 4,999,309 A | * | 3/1991 | Buynoski .................... 438/530 |
| 6,221,709 B1 | * | 4/2001 | Sagarwala et al. .......... 438/231 |

* cited by examiner

*Primary Examiner*—Hoai Ho
*Assistant Examiner*—Thao Lee
(74) *Attorney, Agent, or Firm*—Renner, Otto, Boisselle & Sklar, LLP

(57) ABSTRACT

A CMOS device (10) having p-channel and n-channel transistors with aluminum implanted gates (20). When making the device (10), aluminum is non-selectively implanted to form a source and drain for the n-channel transistor and to reduce the resistivity of the gates (20). The aluminum diffuses through an upper polysilicon layer (22) of the gate, thereby reducing its resistivity, but does not diffuse through a lower oxide layer (24) of the gate, thereby preventing penetration problems. Thereafter, a compensating implant (e.g., phosphorus or arsenic) is selectively implanted to overcompensate the boron previously implanted in the p-type tub.

13 Claims, 3 Drawing Sheets

METHOD FOR MANUFACTURING CMOS DEVICE HAVING LOW GATE RESISTIVITY USING ALUMINUM IMPLANT

FIELD OF THE INVENTION

This invention relates generally to a method for making a complementary metal-oxide semiconductor (CMOS).

BACKGROUND OF THE INVENTION

A CMOS device employs both n-channel and p-channel transistors to form logic elements. A common CMOS device comprises a silicon substrate having p-type and n-type regions (tubs) that define isolated active areas and transistor gates connected to form the input for the device. In a conventional method for making a CMOS device, boron is non-selectively implanted (e.g., without masks) to form sources/drains and to reduce the resistivity of the gates. With this implantation, the boron dose should be such that it diffuses to the bottom of an upper polysilicon level of the gate to prevent depletion effects. At the same time, it is undesirable for the boron to reach a lower oxide level of the gate oxide, as it will diffuse therethrough into the substrate and cause boron penetration problems. Accordingly, the boron-implantation step must balance these objectives and also the objectives necessary for the desired doping of the source/drains.

SUMMARY OF THE INVENTION

The present invention provides a CMOS fabrication process wherein the boron implanting step is replaced or supplemented by an aluminum implanting step. Aluminum diffuses faster than boron and thus reaches the bottom of the polysilicon more quickly, helping to prevent depletion effects. Also, aluminum also does not diffuse through oxide thereby essentially eliminating any substrate penetration problems.

More particularly, the present invention provides a method of making a CMOS device having p-channel and n-channel transistors. The method comprises the step of implanting aluminum to form a source and drain for the n-channel transistor in the p-type tub and to reduce the resistivity of the gates. The aluminum-implanting step can comprise, for example, depositing about $1 \times 10^{14}$ to about $5 \times 10^{14}$ aluminum atoms per square centimeter deposited at an energy of about 100 KeV and thereafter heating the substrate to a temperature of about 1100° C. to about 1200° C. for about 70 to about 90 minutes. Also, a compensating implant (e.g., phosphorus or arsenic) can be implanted over just the p-type tub to overcompensate the aluminum previously implanted therein.

The method can additionally include a supplemental boron implanting step performed after the aluminum implanting step. Such a supplemental boron-implanting step might be necessary or desired if a higher than industrial available dosage of aluminum is required for a desired doping effect. Morever, irrespective of these considerations, an initial aluminum implant is believed to form a sort of shield at the bottom of the gate's polysilicon layer thereby preventing boron penetration through its oxide layer during a subsequent boron implant.

These and other features of the invention are fully described and particularly pointed out in the claims. The following description and drawings set forth in detail a certain illustrative embodiment of the invention, this being indicative, however, of but one of the various ways in which the principles of the invention may be employed.

DRAWINGS

DETAILED DESCRIPTION

Figure 1:
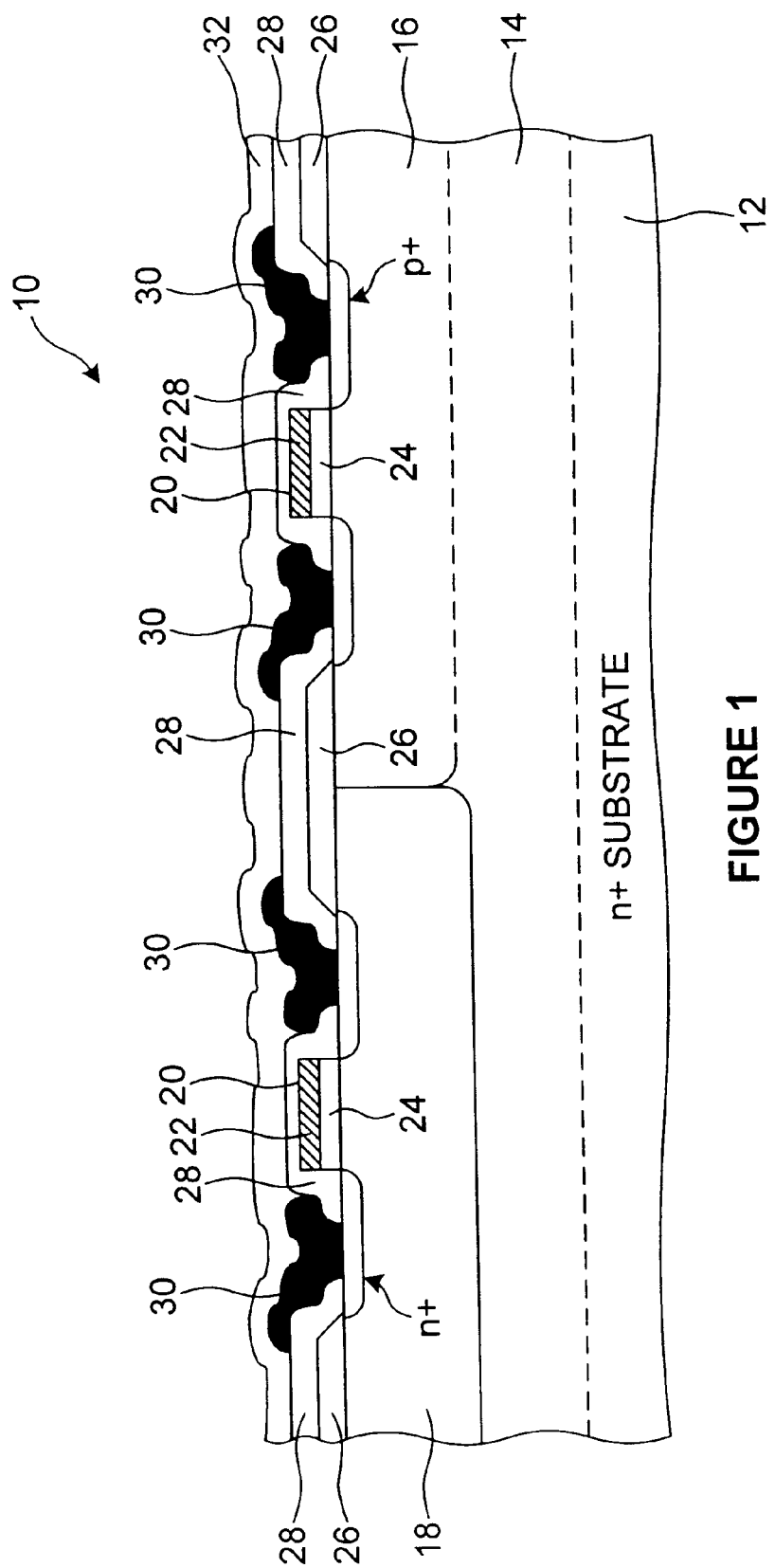
FIG. 1 is a schematic sectional view of a CMOS device according to the present invention.

Referring now to the drawings, and initially to FIG. 1, a CMOS device 10 according to the present invention is shown. The illustrated CMOS device 10 comprises a heavily doped silicon substrate 12 having an upper v-epitaxy layer 14 with n-type and p-type tubs 16 and 18 that define isolated active areas of the device 10. Gates 20 for the p-channel and n-channel transistors include an upper polysilicon layer 22 and a lower gate oxide layer 24. Non-etched regions 26 of a thermal (or field) oxide layer extend between and from each of the tubs 16/18 and non-etched regions 28 of a phosphorous glass layer extend over and around the thermal oxide regions 26 and also the gates 20. The CMOS device 10 further comprises metal contacts 30 to the drain and source junctions and a silicon-nitride layer 32 that seals the device and provides mechanical scratch protection. According to the present invention, the gates 20 are implanted with aluminum instead of, or in addition to, boron.

Figure 2A:
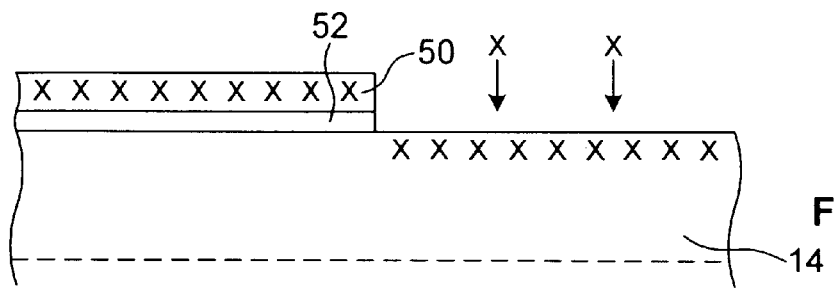
FIGS. 2a–2e are schematic views of a method of making the CMOS device according to the present invention.
Figure 2B:
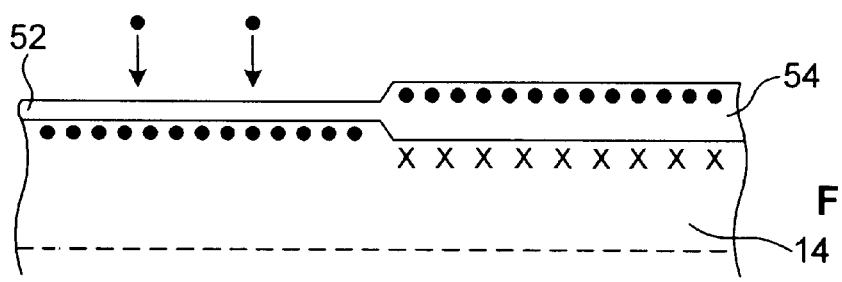
Figure 2C:
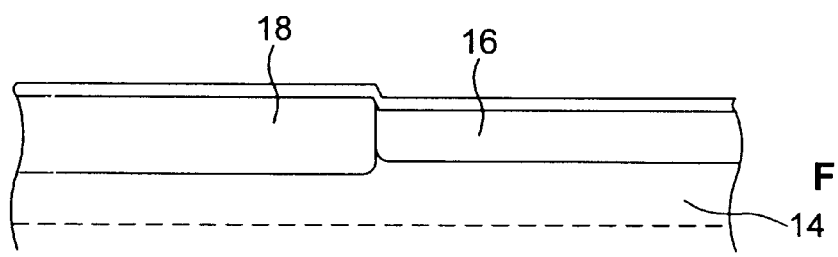
Figure 2D:
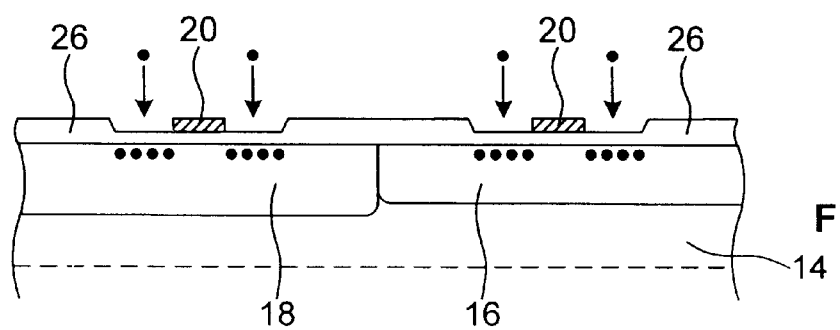
Figure 2E:
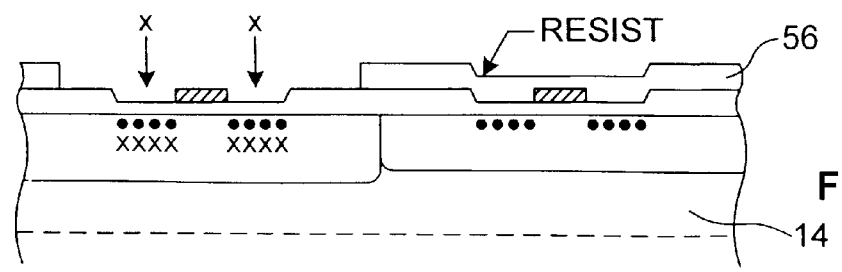

Referring now to FIGS. 2a–2e, a method for making the CMOS device 10 according to the present invention is shown. Initially, a mask having an upper $Si_3N_4$ layer 50 and a thin lower $SiO_2$ layer 52 is provided which covers the p-tub region of the v-epitaxy layer 14 and exposes the n-tub region so that phosphorus can be implanted as the n-tub dopant. (FIG. 2a.) After selective oxidizing over the n-tub region to form a thicker (relative to layer 52) $SiO_2$ layer 54, the nitride is stripped and boron is implanted to form the p-tub region. (FIG. 2b.) The boron enters the silicon through the thin oxide layer 52 but is masked from the n-tub region by the thicker oxide layer 54. All oxides are then stripped and the two tubs 16 and 18 are driven in using conventional techniques. (FIG. 2c.) Before or after the formation of the gates 20 and the field oxide sections 26 (and before or after threshold adjustment implants) aluminum is implanted non-selectively across both of the regions 16 and 18 using conventional techniques. (FIG. 2d.) Phosphorus or arsenic is selectively implanted into the n-channel source/drain regions at a higher dose, so that it overcompensates the aluminum. (FIG. 2e.) Thereafter, the metal contacts 30 are formed by aluminum metallization and dry etching techniques and the silicon nitride layer 32 is plasma-deposited to provide the CMOS device 10 shown in FIG. 1.

Figure 3A:
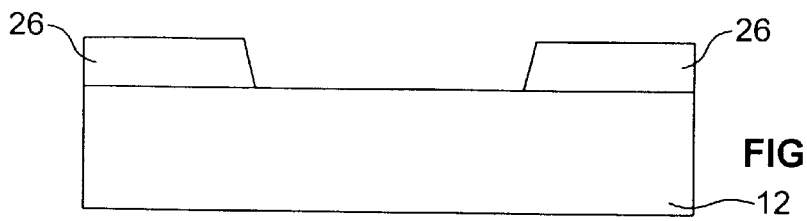
FIGS. 3a–3e are schematic views of gate forming steps.
Figure 3B:
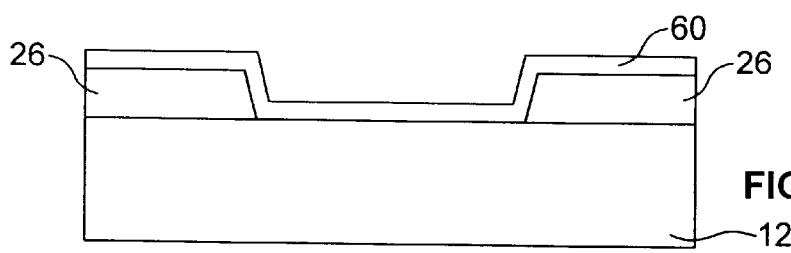
Figure 3C:
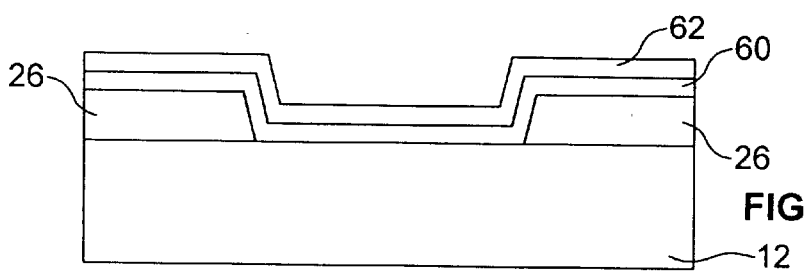
Figure 3D:
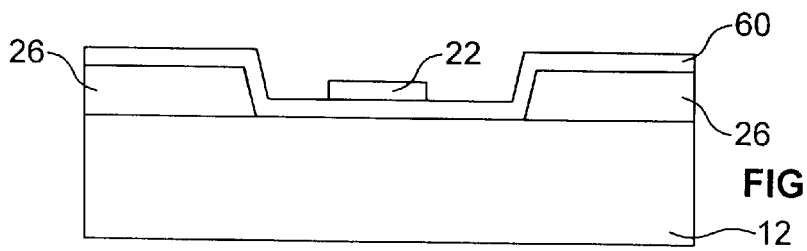
Figure 3E:
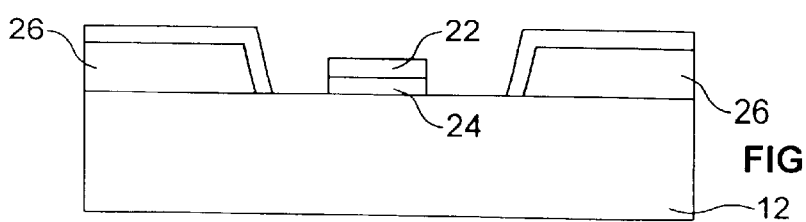

Details of the formation of the gates 20 are shown in FIGS. 3a–3e. First, the $SiO_2$ layers 52 and 54 (FIG. 2c) are selectively etched to form the field oxide sections 26. (FIG. 3a.) The sections 26 are then covered with a thin oxide layer 60 and a polysilicon layer 62 is deposited thereon. (FIGS. 3b and 3c.) The polysilicon layer 62 is patterned and etched to form the upper layers 22 of the gates 20. (FIG. 3d). The regions of the thin oxide layer 60 not covered by the polysilicon layer 22 are then etched away with the remaining covered sections forming the lower layers 24 of the gates 20. (FIG. 3e.)

During the aluminum implantation step (FIG. 2d), the aluminum diffuses through the upper polysilicon level 22 of the gates 20 and desirably reduces the relatively high resistivity of the polysilicon. Aluminum diffuses faster than boron and thus will reach the bottom of the polysilicon layer more quickly, helping to prevent depletion effects. Aluminum also does not diffuse through oxide, thereby eliminating the under-the-gate substrate penetration problems that often occur with boron implants.

The aluminum dose is selected to provide the doping required by the process being implemented and the energy is selected to ensure that the bulk of the aluminum ions penetrate into the silicon to a desired depth. For example, about $1 \times 10^{14}$ to about $1 \times 10^{15}$ aluminum atoms per square centimeter deposited at an energy of about 100 KeV would be suitable implanting parameters. After the implant, the substrate is heated to a temperature (e.g., about 1100° C. to about 12000° C. for a sufficient amount of time (e.g., about 70 to about 90 minutes) so that the aluminum will diffuse rapidly to the desired depth and dominate the implanted regions.

A supplemental boron implanting step can be incorporated into the method of the present invention, as may be necessary or desired in certain situations. For example, if the maximum usable dose of aluminum is about $1 \times 10^{14}$ to about $1 \times 10^{15}$ aluminum atoms per square centimeter, and this will not provide the desired doping effect, the balance can be provided with boron. Also, lower doses of aluminum might be necessary to prevent aluminum oxide formation and subsequent leakage. Morever, irrespective of maximum dosage considerations, an initial aluminum implant will form a sort of shield at the bottom of the gate's polysilicon layer 22 thereby helping to prevent boron penetration through the oxide layer 24. This allows a degree of freedom during implantation in that it easier to avoid depletion effects if they do not have to be counterbalanced against penetration problems.

One can now appreciate that the present invention provides a CMOS fabrication process wherein the boron implanting step is replaced or supplemented by an aluminum implanting step, thereby preventing depletion effects within the gates and eliminating substrate penetration problems below the gate. Although the invention has been shown and described with respect to the preferred embodiment, it is apparent that certain alterations and modifications will occur to others skilled in the art upon a reading and understanding of this specification. The present invention includes all such alterations and modifications and is limited only by the following claims.

What is claimed is:

1. A method of making a CMOS device having a p-channel transistor and an n-channel transistor, said method comprising the steps of:

providing a substrate having an n-type tub in which the p-channel transistor is to be formed and a p-type tub in which the n-channel transistor is to be formed;

forming a transistor gate disposed over each tub and each gate including an upper polysilicon level and a lower oxide level; and non-selectively implanting aluminum into:
   both of the tubs, the aluminum providing dopant species for a source region and a drain region of the p-channel transistor and being present in a source region and a drain region of the n-channel transistor; and
   both of the upper polysilicon levels of the gates to reduce the resistivity of the upper polysilicon levels of each of the gates.

2. A method as set forth in claim 1, further comprising diffusing at least some of the aluminum implanted into the upper polysilicon levels towards a bottom of the respective upper polysilicon levels and adjacent the lower oxide levels, the diffused aluminum effective to reduce depletion effects in the p-channel transistor and the n-channel transistor.

3. A method as set forth in claim 2, wherein the diffused aluminum forms a barrier region in the upper polysilicon level effective to reduce boron penetration into the lower oxide level during a subsequent boron implantation.

4. A method as set forth in claim 1, further comprising diffusing at least some of the aluminum implanted into the upper polysilicon levels towards a bottom of the respective upper polysilicon levels and adjacent the lower oxide levels, the diffused aluminum forms a barrier region in the upper polysilicon level effective to reduce boron penetration into the lower oxide level during a subsequent boron implantation.

5. A method as set forth in claim 1, further comprising the step of non-selectively implanting a supplemental boron dose into both of the tubs to increase an amount of p-type dopant for the source and the drain of the p-channel transistor in the n-type tub.

6. A method as set forth in claim 5, wherein said supplemental boron-implanting step is performed after said aluminum-implanting step.

7. A method as set forth in claim 5, further comprising the step of selectively implanting a compensating implant into just the p-type tub, after the aluminum-implanting step and the supplemental boron-implanting step, to overcompensate the aluminum and boron previously implanted therein and thereby form the source and the drain of the n-channel transistor.

8. A method as set forth in claim 1, wherein said aluminum-implanting step includes a dose of about $1 \times 10^{14}$ to about $5 \times 10^{14}$ aluminum atoms per square centimeter at an energy of about 100 KeV.

9. A method as set forth in claim 8, wherein said aluminum-implanting step further comprises heating the substrate to a temperature of about 1100 C to about 1200 C for about 70 to about 90 minutes after said aluminum-implanting step.

10. A method as set forth in claim 1, further comprising the step of selectively implanting a compensating implant into just the p-type tub, after the aluminum-implanting step, to overcompensate the aluminum implanted therein during the aluminum-implanting step and thereby form the source and the drain of the n-channel transistor.

11. A method as set forth in claim 10, wherein the selective-implanting step comprises implanting phosphorus or arsenic.

12. A method as set forth in claim 1, wherein forming the transistor gates includes:

covering the substrate with a field oxide layer;

selectively etching the field oxide layer to form windows exposing a portion of each of the p-tub and n-tub;

conforming a gate oxide layer over the field oxide and the exposed p-tub and n-tub portions;

conforming a polysilicon layer over the gate oxide layer;

etching the polysilicon layer to form the upper polysilicon levels of the gates; and etching the gate oxide layer to form the lower oxide levels of the gates.

13. A method as set forth in claim 1, wherein said substrate-providing step comprises implanting phosphorous in a region of the substrate to form the n-tub and/or implanting boron in a region of the substrate to form the p-type tub.

* * * * *